(12) United States Patent
Hernandez

(10) Patent No.: US 8,329,498 B2
(45) Date of Patent: *Dec. 11, 2012

(54) METHOD OF MANUFACTURING A SEMICONDUCTOR WAFER COMPRISING AN INTEGRATED OPTICAL FILTER

(75) Inventor: Caroline Hernandez, Peyrolles (FR)

(73) Assignee: STMicroelectronics Rousset SAS, Rousset (FR)

( * ) Notice: Subject to any disclaimer, the term of this patent is extended or adjusted under 35 U.S.C. 154(b) by 74 days.

This patent is subject to a terminal disclaimer.

(21) Appl. No.: 12/916,363

(22) Filed: Oct. 29, 2010

(65) Prior Publication Data

US 2011/0045625 A1    Feb. 24, 2011

Related U.S. Application Data

(62) Division of application No. 11/779,171, filed on Jul. 17, 2007, now Pat. No. 7,851,826.

(30) Foreign Application Priority Data

Jul. 19, 2006   (FR) ..................................... 06 06562

(51) Int. Cl.
  *H01L 21/00* (2006.01)
(52) U.S. Cl. .... 438/70; 257/234; 257/440; 257/E27.134
(58) Field of Classification Search .............. 438/70–72, 438/60, 75; 257/234, 225, 440, E27.134, 257/E27.159
See application file for complete search history.

(56) References Cited

U.S. PATENT DOCUMENTS

| 6,221,687 | B1 | 4/2001 | Abramovich |
| 6,362,498 | B2 | 3/2002 | Abramovich |
| 7,061,106 | B2 | 6/2006 | Yang et al. |
| 7,262,405 | B2 | 8/2007 | Farnworth et al. |
| 7,293,908 | B2 | 11/2007 | Beeson et al. |
| 2003/0197210 | A1 | 10/2003 | Uchida |
| 2005/0224694 | A1 | 10/2005 | Yaung |
| 2007/0284687 | A1 | 12/2007 | Rantala |

FOREIGN PATENT DOCUMENTS

| EP | 0 540 215 A2 | 5/1993 |
| JP | 7-170366 A | 7/1995 |
| WO | 02/16976 A2 | 2/2002 |

*Primary Examiner* — David Vu
(74) *Attorney, Agent, or Firm* — Seed IP Law Group PLLC

(57) ABSTRACT

A method manufactures semiconductor chips each comprising a component implanted in the semiconductor. The method includes collectively implanting components onto a front face of a semiconductor wafer and fixing a plate of a transparent material onto the front face of the wafer. Fixing the plate of transparent material is preceded by a step of depositing, on the front face of the wafer, at least one layer of polymer material forming an optical filter. Application is particularly to the manufacturing of imagers.

22 Claims, 4 Drawing Sheets

METHOD OF MANUFACTURING A SEMICONDUCTOR WAFER COMPRISING AN INTEGRATED OPTICAL FILTER

BACKGROUND OF THE INVENTION

1. Field of the Invention

The present invention relates to the manufacturing of a semiconductor wafer covered with a plate of glass and particularly to the manufacturing of a wafer comprising CMOS imagers.

2. Description of the Related Art

Imagers produced according to the CMOS ("Complementary Metal Oxide Semiconductor") technology are the subject of an increasing number of applications due to their low cost price in comparison with CCD ("Charge Coupled Device") imagers. Such CMOS imagers were initially used to produce low resolution image sensors of mediocre quality (for example web cameras). Today, after major investment in research and development, CMOS imagers can compete with CCD imagers. One embodiment of the present invention is in line with an effort to develop and improve this imager technology aiming to reduce the cost prices with at least equal image quality.

Figure 1:
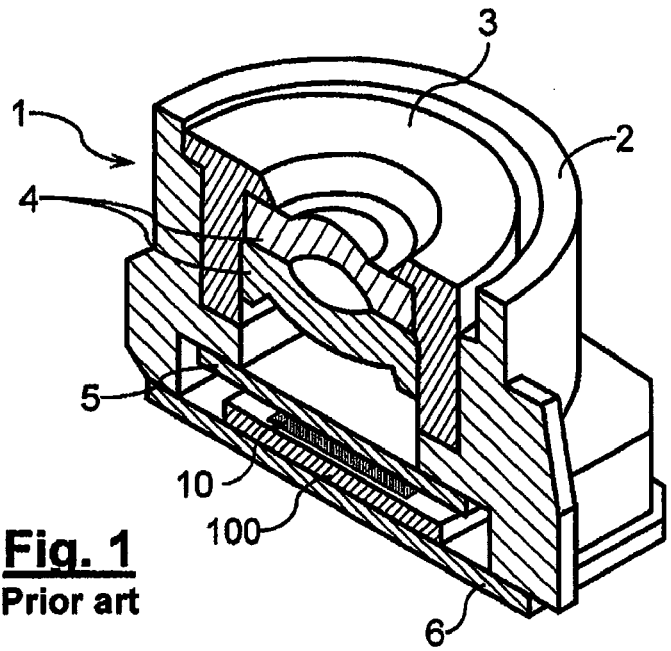

FIG. 1 represents an example of a module for capturing images and/or video using a CMOS imager, intended for example to be mounted into a portable device such as a mobile telephone, a camera or a video camera. The module 1 comprises a frame 2, an optical set 3, lenses 4 fitted into the block 3, an optical filter 5 and a base 6. A semiconductor chip 100 integrating a CMOS imager 10, is disposed on the base 6 and receives the light passing through the lenses 4 and the filter 5. The filter 5 is generally an infrared filter (consumer applications) but can also be a specific filter for industrial applications needing to capture images in a certain frequency range or to reject certain frequency ranges.

The CMOS imager 10 comprises photosites each forming one pixel (not visible in FIG. 1). Each pixel comprises a photodiode and a control and interconnection circuit of the photodiode. The pixels are arranged as an array and a mosaic of red, green and blue filters is distributed over the pixel array, generally according to the Bayer architecture.

Figure 2:
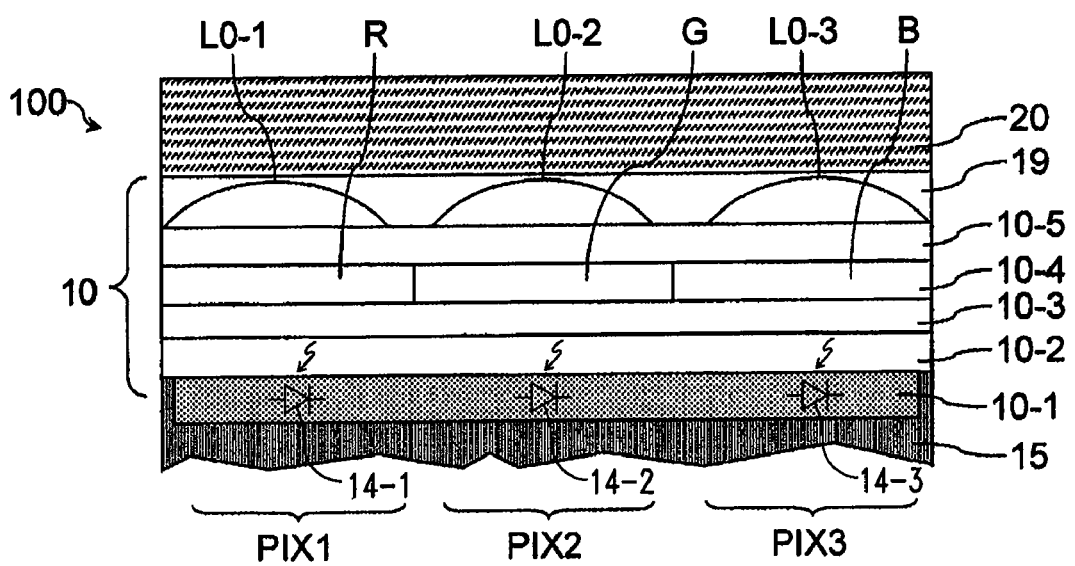

FIG. 2 is a schematic cross-section of the chip 100 and of the imager 10 in a region corresponding to three pixels PIX1, PIX2, PIX3. A semiconductor substrate 15 into which the imager 10 is implanted, and a glass chip 20 fixed onto the imager through a layer of glue 19 can be distinguished.

Going from bottom to top, the imager 10 comprises layers 10-1, 10-2, 10-3, 10-4, 10-5 and microlenses L0-1, L0-2, L0-3. The layer 10-1 represents the active part of the imager and comprises photodiodes 14-1, 14-2, 14-3 and their associated control and interconnection circuits (not detailed). The layer 10-2 is a dielectric material that entirely covers the substrate 15. The layer 10-3 is a passivating layer deposited on the imager at the end of the manufacturing process. The layer 10-4 is formed by colored resins and comprises red, green or blue areas R, G, B forming the above-mentioned primary color filters, with one color filter per pixel. The layer 10-5 is an intermediate layer of resin forming a base for the microlenses L0 and providing good flatness ("planarization" layer). The microlenses L0 are arranged in a "MLA" (Microlens Array) with one microlens per pixel, and are covered with the layer of glue 19 and with the glass chip 20.

Figure 3A:
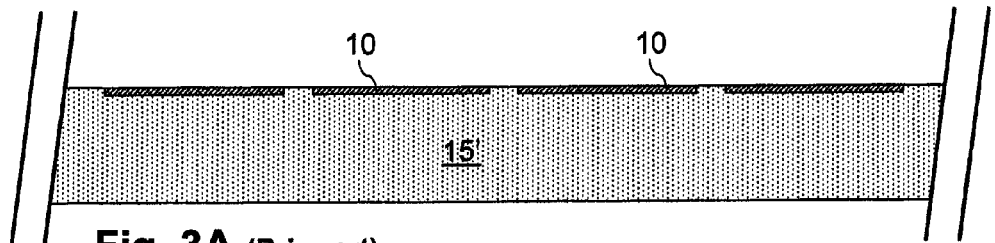
Figure 3B:
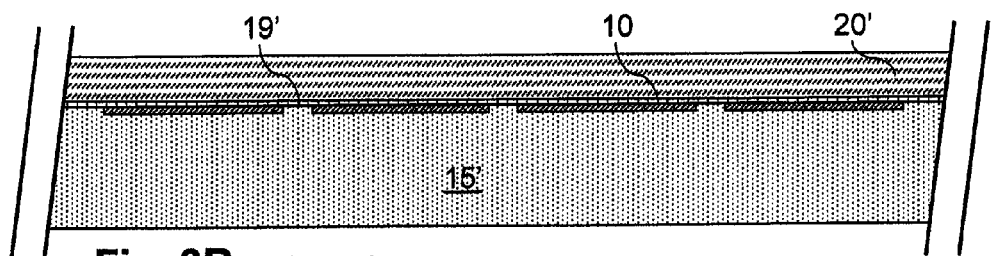
Figure 3C:
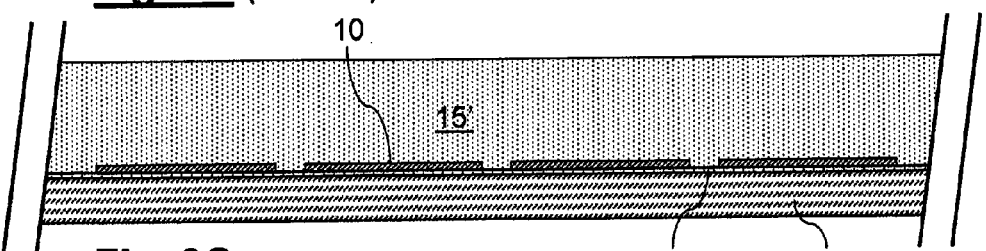

Steps of a classic method of manufacturing the imager chip 100 are represented in FIGS. 3A to 3E. The method first of all comprises the collective manufacturing of a plurality of imagers 10 on a silicon wafer 15', as represented in FIG. 3A. In the step shown in FIG. 3B, a glass plate 20' is fixed onto the front face of the wafer 15' through a layer of glue 19' covering the entire wafer, the glue comprising for example epoxy, urethane, silicon, etc. In the step in FIG. 3C, the wafer 15' is turned over and is put on a base (not represented) to treat its rear face. This treatment on the rear face comprises at least one step of thinning the wafer, a step of etching and a step of sawing the wafer to obtain a plurality of imager chips like the chip 100.

Figure 3D:
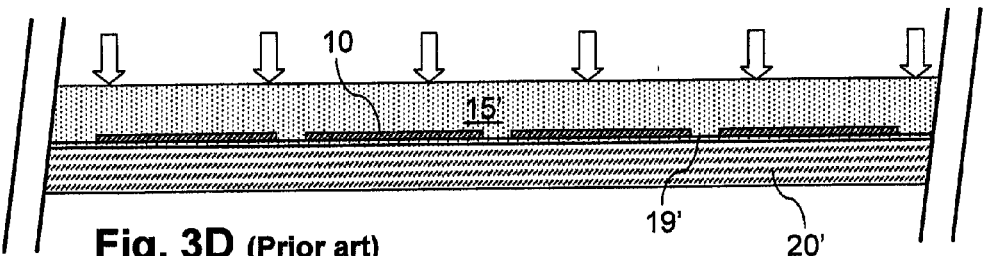

The step of thinning, represented in FIG. 3D, is generally performed by backlapping, and comprises the grinding and the polishing of the rear face. The thickness of the wafer, initially in the order of a few hundred micrometers is in the order of a few tens or one hundred micrometers at the end of the process.

Figure 3E:
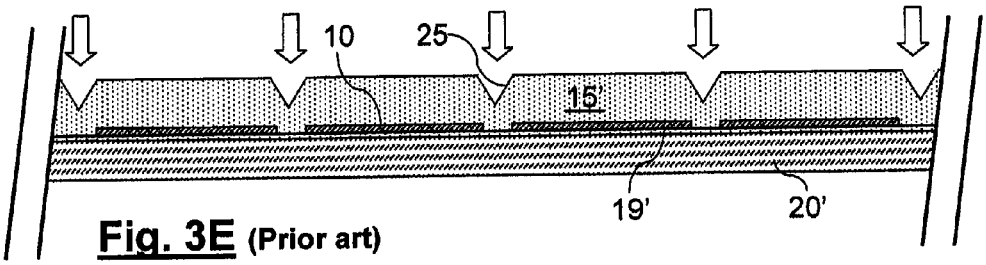

The step of etching, represented in FIG. 3E, enables grooves 25 to be obtained on the rear face of the wafer. These grooves can be provided for various reasons, for example to facilitate the subsequent cutting of the wafer or to produce contacts on the rear face. The grooves 25 are generally produced by chemical etching or plasma etching.

A micro-module for capturing images as represented in FIG. 1 has the disadvantage of having a relatively complex structure and of requiring considerable assembly time, which increases its cost price.

In particular, the filter 5 is an additional component of a high cost price and requires a dedicated manufacturing line, then steps of storing, handling and assembling.

BRIEF SUMMARY OF THE INVENTION

One embodiment is a filter that is less costly to produce and simpler to assemble than the classic filter previously described.

One embodiment is based on the simple but no less inventive principle of adding on the surface of the finished wafer as represented in FIG. 3A, prior to or at the time of fixing the glass plate 20' (FIG. 3B), layers of polymer material having different optical indices so as to produce a filtering function, for example of infrared filtering.

Thus, the filter 5 in the micro-module represented in FIG. 1 is no longer necessary.

More particularly, one embodiment provides a method for manufacturing semiconductor chips each comprising at least one component implanted in the semiconductor, the method comprising a step of collectively implanting components on a front face of a semiconductor wafer, a step of fixing a plate of a transparent material onto the front face of the wafer, wherein the step of fixing the plate of transparent material is preceded by a step of depositing, on the front face of the wafer, at least one layer of a polymer material forming an optical filter.

According to one embodiment, the step of fixing the plate of transparent material is preceded by a step of depositing, on the front face of the wafer, several layers of polymer material(s) forming together a multi-layer optical filter.

According to one embodiment, at least the last layer of the filter is a layer of glue fixing the plate of transparent material.

According to one embodiment, any layer forming the filter is a layer of glue.

According to one embodiment, the method comprises a step of covering the optical filter with a layer of glue fixing the plate of transparent material and not involved in the optical filtering function.

According to one embodiment, the polymer material of each layer of the filter is chosen from the group comprising light-sensitive resins, planarizing resins and glues.

According to one embodiment, each layer of the filter is polymerized prior to depositing the next layer.

According to one embodiment, at least one layer of the filter is not polymerized prior to depositing the next layer, which is miscible with the non-polymerized layer, so as to form a resulting layer with a progressively varying optical index that is then polymerized.

According to one embodiment, at least one layer of the optical filter is deposited by spin coating.

According to one embodiment, the method comprises a step of cutting the wafer into individual chips.

According to one embodiment, the step of implanting components onto a face of the wafer comprises the implantation of imagers intended to capture images through the plate of transparent material and the optical filter.

According to one embodiment, the plate of transparent material is made of glass.

One embodiment relates to an imager comprising a plate of transparent material fitted onto the semiconductor chip, through which the imager receives images to be captured, and comprising, between the semiconductor chip and the plate of transparent material, at least one layer of polymer material forming an optical filter.

According to one embodiment, the imager comprises between the semiconductor chip and the plate of transparent material several layers of polymer material(s) forming together a multi-layer optical filter.

According to one embodiment, the optical filter is covered with a layer of glue fixing the plate of transparent material and not involved in the optical filtering function.

According to one embodiment, the last layer of polymer material of the optical filter is a layer of glue fixing the plate of transparent material.

According to one embodiment, any layer of polymer material forming the multi-layer optical filter is a layer of glue.

According to one embodiment, any layer of the optical filter is formed by a material belonging to the group comprising light-sensitive resins, planarizing resins and glues.

According to one embodiment, the optical filter has a graduated optical index.

According to one embodiment, the multi-layer optical filter has a progressively varying optical index.

According to one embodiment, the plate of transparent material is made of glass.

One embodiment also relates to a portable device comprising a photographic or video module equipped with an imager.

BRIEF DESCRIPTION OF THE SEVERAL VIEWS OF THE DRAWING(S)

Figure 4A:
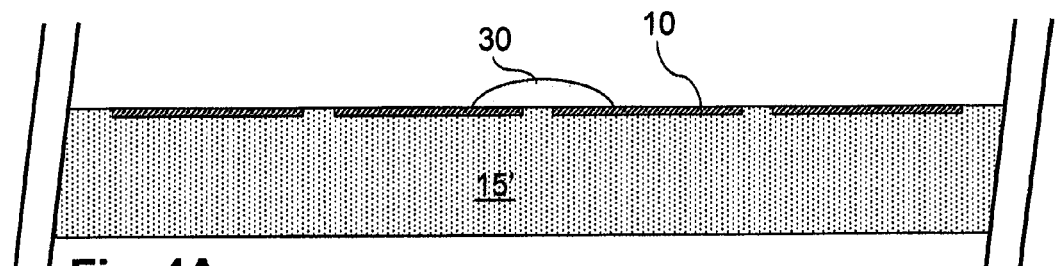
Figure 4B:
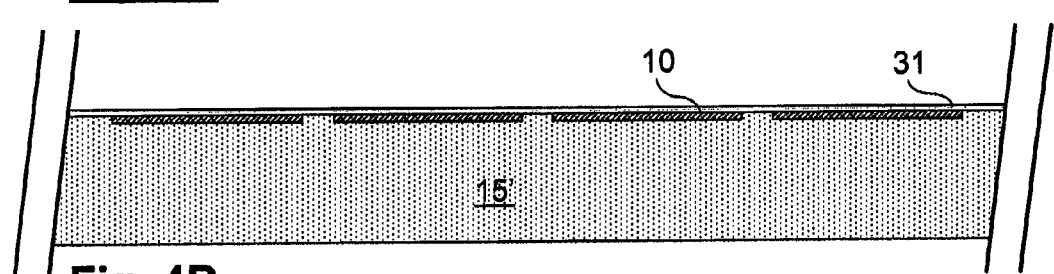
Figure 4C:
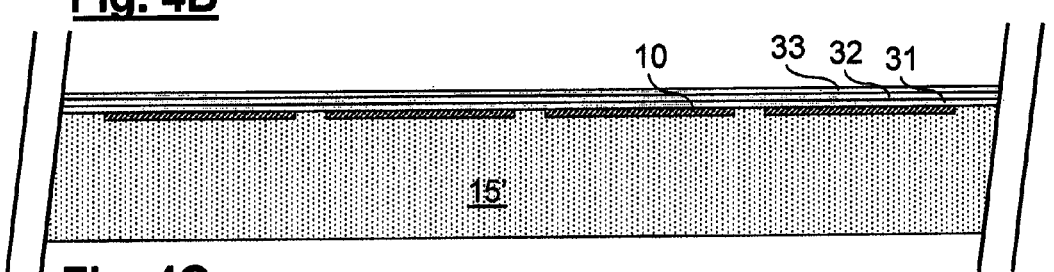
Figure 4D:
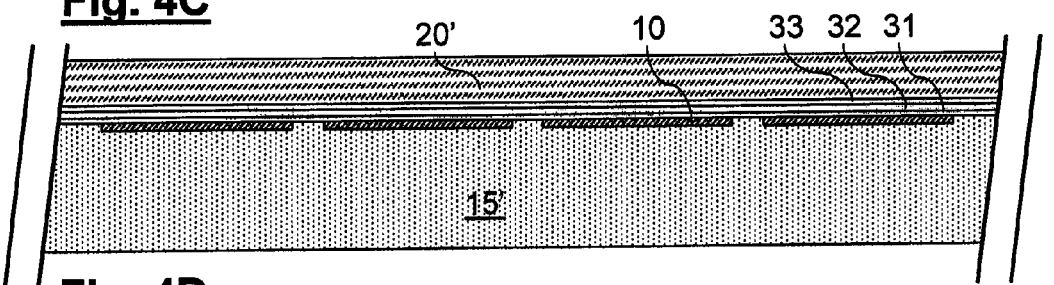
Figure 5:
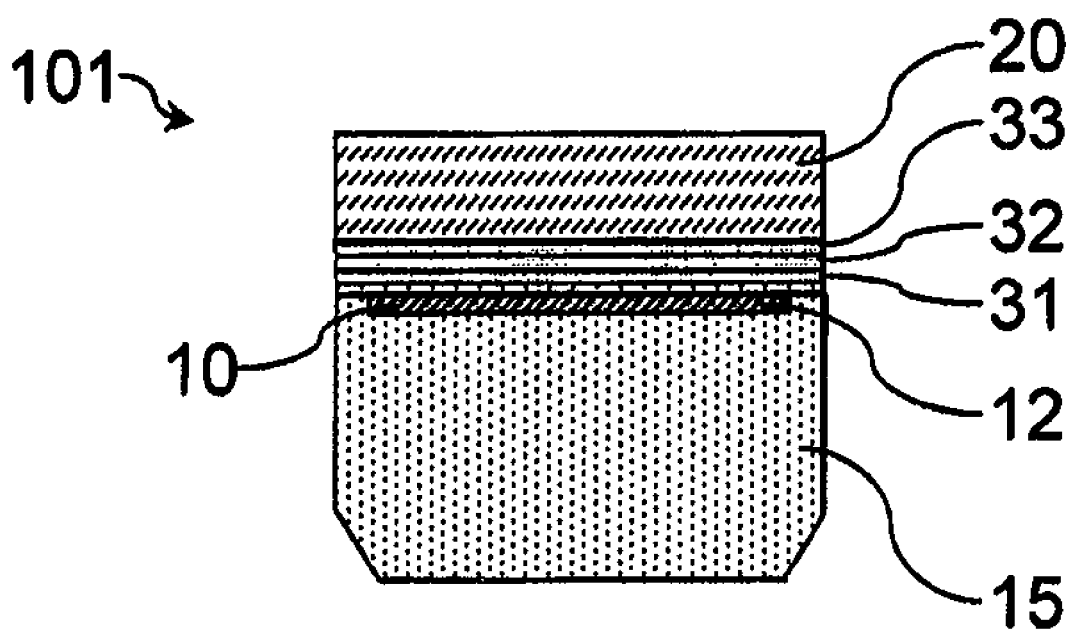

These and other, features and advantages will be explained in greater detail in the following description of the process, given in relation with, but not limited to the following figures, in which:

FIG. 1 described above represents a module for capturing images for portable device, FIG. 2 described above is a schematic cross-section of an imager chip, FIGS. 3A to 3E described above show a method for manufacturing imagers on a semiconductor wafer, FIGS. 4A to 4D represent steps of producing a filter according to one embodiment, and FIG. 5 represents an imager chip according to one embodiment.

DETAILED DESCRIPTION OF THE INVENTION

An example of implementation of the method will be described here within the scope of manufacturing imagers on a semiconductor wafer as shown in FIGS. 3A to 3E described above.

One embodiment provides for depositing several layers of a hardenable polymer material on the finished wafer 15' as represented in FIG. 3A (i.e., the wafer 15' equipped with imagers 10), prior to mounting the glass plate 20'.

These layers, and at least the last layer deposited prior to mounting the glass plate 20', are for example layers of glues (epoxy, urethane, silicone, etc.) having determined optical indices. If necessary, colored or non-colored additives are added to the formulas of standard glues so as to obtain determined optical indices. Generally speaking, it is currently easy to obtain any type of glue or other polymer material defined by precise specifications stipulating in particular the color and the optical index desired.

The layers can be produced with the same polymer material but containing different additives, or with different polymer materials, or a combination of these two possibilities.

In prior art, the layer of glue 19' (FIG. 3B) which enables the glass plate 20' to be fixed has substantially the same optical index as glass, so that its presence does not cause parasitic diopters to appear. On the contrary, the various layers 31-33 of polymer material (or of polymer materials) described below have distinct optical indices, so that the set of the layers form a multi-layer optical filter.

These layers of polymer material are preferably deposited by spin coating. The polymer material can be liquid or gelatinous. It is then polymerized according to the required conditions (UV polymerization or thermal polymerization).

Thus, in the step represented in FIG. 4A, a small quantity of polymer material 30, in the order of a few milliliters, is deposited on the wafer 15', preferably in the center of the wafer. In the step represented in FIG. 4B, the material 30 is spread over the entire surface of the wafer 12' by centrifugation. The speed of rotation of the wafer is initially quite low, for example 1,500 rpm. A strong acceleration, for example up to 20,000 rpm, is then applied to the wafer to favor the formation of a uniform layer 31 over the entire surface of the glass plate while eliminating the surplus polymer material. The speed of rotation is then stabilized at a lower value, for example in the order of 2,000 to 7,000 rpm, so as to define the thickness of the layer 31. The rotation is further maintained for a certain time to enable the solvent to evaporate. The evaporation of the solvent substantially decreases the viscosity of the polymer material on which the thickness of the film depends. As the evaporation is fast, it helps to make sure that the spreading time of the polymer material is short. During the rotation at high speed, the largest part of the solvent contained in the material evaporates and finally produces a solid film.

A step of baking is then conducted. This step ensures the rapid elimination of the residual solvents and the polymerization of the layer 31. A contraction (volume shrinkage) of the polymer material follows, that causes a loss of thickness in the order of a fraction of a percent to a few percent, depending on the material used.

The wafer is for example heated by means of hot plates taken to a temperature in the order of one hundred to a few hundred degrees (generally speaking 100-300° C.). The duration of the heating cycle is adjusted to reach the desired solvent rate, and can be of a few minutes to more than one hour. The baking is followed by a step of cooling the wafer, for example by means of plates at ambient temperature.

As an alternative, and depending on the material chosen, the step of polymerizing can also be conducted by exposing the wafer to an ultraviolet radiation. Ultraviolet polymerization is generally shorter than thermal polymerization and only lasts a few minutes at the most.

In the step shown in FIG. 4C, two other polymer layers 32, 33 have been deposited on the layer 31, the last layer 33 also serving as a layer of glue for the step of sticking the glass plate 20' represented in FIG. 4D. A multi-layer optical filter with graduated optical index has thus been produced below the glass plate 20'.

Those skilled in the art will note that it is possible for the polymer layers extending beneath the last layer (here the layer 33) not to be glues, and that they could for example be light-sensitive resins (for example the "CT" resins used to manufacture the microlenses of the imagers) or "planarizing" resins (resins used to form flat surfaces in microelectronics), color resins, etc.

Furthermore, the classic layer of glue 19' (FIG. 2, FIG. 3B) may be deposited on the wafer prior to depositing the layers 31 to 33, to flatten the surface of the wafer above the microlenses L0. The layer of glue 19' can also be deposited on the layers 31 to 33 so as to stick the glass plate. In this case, it is possible for all the layers forming the filter not to be glues. Furthermore, a layer of glue 19' or any flatness layer ("planarizing" layer) can be deposited beneath the layers 31 to 33 and a layer of glue 19' be deposited on the layers 31 to 33.

In an alternative embodiment, the layer 31 is not polymerized prior to depositing the layer 32 and the layer 32 is also not polymerized prior to depositing the layer 33. The polymer materials forming the layers are then provided miscible (it may be the same material with different additives, as indicated above) such that the final layer obtained has an optical index varying progressively. A final step of polymerization is applied to the set of the layers after they are deposited. If no layer of glue is added onto the multi-layer filter to fix the glass plate, this polymerization is performed after mounting the glass plate so that the multi-layer structure sticks to the glass plate.

As represented in FIG. 5, an imager chip 101, obtained by cutting the wafer, differs from the classic chip 100 represented in FIG. 2 by the presence of the layers 31, 32, 33 forming a filter between the silicon 15 and the glass chip 20.

It will be understood by those skilled in the art that various other applications and alternative embodiments of the method are possible. In particular, the number of layers deposited to form the filter can vary depending on the filter desired (infrared, ultraviolet, etc.) and the polymer materials used, the example of the three layers 31 to 33 described above being in no way limitative.

A filter can also comprise a single layer only, if it is possible to produce a polymer composition offering by itself all the optical properties sought.

The method thus enables modules for capturing images embedded in portable devices such as mobile telephones, cameras and video cameras, etc., to be produced without the need to arrange a filter distinct from the imager chips in these modules.

Moreover, although the method has been described above in relation with the manufacturing of a semiconductor wafer comprising a glass plate, a transparent material other than glass can be used, for example Plexiglas.

The method can further be applied to the production of any type of optical filters on wafers designed to let an electromagnetic radiation through, in the visible, infrared, ultraviolet or even beyond, or to filter a large or narrow frequency band.

The invention claimed is:

1. A method comprising:
collectively implanting components on a front face of a semiconductor wafer;
forming an optical filter of polymer material on the front face of the semiconductor wafer, the forming including forming a filter layer with a progressively varying optical index, wherein forming the filter layer includes depositing a first layer, depositing a second layer without previously polymerizing the first layer, the second layer mixing with the non-polymerized first layer, and polymerizing the mixed first and second layers; and
affixing a plate of a transparent material onto the optical filter.

2. The method according to claim 1, wherein the optical layer is a multi-layer optical filter and forming the optical filter includes depositing, on the front face of the wafer, several layers of one or more polymer material prior to affixing the plate of transparent material onto the optical filter.

3. The method according to claim 2, wherein forming the optical filter includes forming a last layer, which is a layer of glue configured to fix the plate of transparent material to the optical filter.

4. The method according to claim 1, wherein the optical filter includes at least one layer of glue.

5. The method according to claim 1, comprising covering the optical filter with a layer of glue configured to fix the plate of transparent material to the optical filter, the layer of glue not being configured to provide optical filtering.

6. The method according to claim 1, wherein the polymer material of each layer of the filter is chosen from a group consisting of light-sensitive resins, planarizing resins and glues.

7. The method according to claim 1, wherein at least one layer of the optical filter is deposited by spin coating.

8. The method according to claim 1, comprising cutting the wafer into individual chips.

9. The method according to claim 1, wherein implanting components onto the front face of the wafer comprises the implantation of imagers configured to capture images through the plate of transparent material and the optical filter.

10. The method according to claim 1, wherein the plate of transparent material is made of glass.

11. A method, comprising:
forming an imager, including:
a plurality of photodiodes positioned in a semiconductor substrate;
forming an array of color filters arranged above the photodiodes, the color filters including filters of three different colors; and
forming an array of microlenses arranged above the color filters, respectively;
forming a plate of transparent material arranged above the imager; and
forming an optical filter arranged between the imager and the plate of transparent material and above the photodiodes, color filters, and microlenses, the optical filter including at least one layer of polymer material, wherein a last layer of the optical filter is a layer of glue fixing the plate of transparent material to the optical filter, the layer of glue having an optical index which is different from an optical index of the plate of transparent material.

12. The method according to claim 11, wherein forming the optical filter includes forming several layers of one or more polymer materials.

13. The method according to claim 11, wherein forming the optical filter using layers of glue.

14. The method according to claim 11, wherein forming the optical filter using materials belonging to a group consisting of light-sensitive resins, planarizing resins and glues.

15. The method according to claim 11, wherein the optical filter has a graduated optical index and includes plural polymer layers having differing respective optical indices.

16. The method according to claim 11, wherein the optical filter includes a single layer having a progressively varying optical index.

17. The method according to claim 11, wherein forming the optical filter includes forming a filter layer with a progressively varying optical index, wherein forming the filter layer includes depositing a first layer, depositing a second layer without previously polymerizing the first layer, the second layer mixing with the non-polymerized first layer, and polymerizing the mixed first and second layers.

18. A method, comprising:
    forming an imager, the forming including:
        forming an image capturing integrated circuit in a semiconductor substrate;
        forming an array of color filters arranged above the image capturing integrated circuit, the color filters including filters of three different colors; and
        forming an array of microlenses arranged above the color filters, respectively;
    forming a transparent plate coupled to the semiconductor substrate; and
    forming an optical filter on the semiconductor substrate between the integrated circuit and the transparent plate, the optical filter including a polymer region having an index of refraction that varies continuously with a depth of the region.

19. The method of claim 18, wherein forming the optical filter comprises forming multiple polymer layers.

20. The method of claim 19 wherein the multiple polymer layers are made from different polymers.

21. The method of claim 19 wherein the multiple polymer layers have different indices of refraction.

22. The method according to claim 18, wherein forming the optical filter includes forming a filter layer with a progressively varying optical index, wherein forming the filter layer includes depositing a first layer, depositing a second layer without previously polymerizing the first layer, the second layer mixing with the non-polymerized first layer, and polymerizing the mixed first and second layers.

\* \* \* \* \*